United States Patent
Aita

[11] Patent Number: 5,854,488
[45] Date of Patent: Dec. 29, 1998

[54] ION BEAM MACHINING METHOD AND DEVICE THEREOF

[75] Inventor: Kazuo Aita, Chiba, Japan

[73] Assignee: Seiko Instruments Inc., Japan

[21] Appl. No.: 879,342

[22] Filed: Jun. 20, 1997

[30] Foreign Application Priority Data

Jun. 20, 1996 [JP] Japan .................................. 8-160301

[51] Int. Cl.$^6$ .................................................. H01J 37/317
[52] U.S. Cl. .......................................................... 250/309
[58] Field of Search .............................. 250/309, 492.2, 250/492.3, 492.21

[56] References Cited

U.S. PATENT DOCUMENTS

| | | | |
|---|---|---|---|
| 4,983,830 | 1/1991 | Iwasaki | 250/309 |
| 5,376,791 | 12/1994 | Swanson et al. | 250/309 |

Primary Examiner—Kiet T. Nguyen
Attorney, Agent, or Firm—Adams & Wilks

[57] ABSTRACT

To carry out machining by a focused ion beam using an assist gas including steam gas. In a machining operation by a focused ion beam by using an assist gas including steam gas, as a method of supplying steam gas, the steam gas is supplied from salt hydrate and the pressure of steam is controlled by controlling the temperature of the salt hydrate. As a method for supplying steam gas, when the steam gas is introduced into a vacuum chamber, the flow rate needs to be controlled by a control valve since the vapor pressure of water is very high, which amounts to a complicated gas supply system and which amounts to an expensive device. However, steam vapor having a low pressure is supplied by using salt hydrate, the introduction of gas to a vacuum chamber is made feasible only by passing the gas through a friction pipe and the amount of introducing a gas can be controlled by a simple system where only the temperature of the salt hydrate is controlled by an inexpensive temperature controller.

5 Claims, 3 Drawing Sheets

ION BEAM MACHINING METHOD AND DEVICE THEREOF

BACKGROUND OF THE INVENTION

The present invention relates to a focused ion beam device for carrying out an ion beam machining such as, film depositing, etching, selective etching or the like by blowing an assist gas to a predetermined region simultaneously with scanning the predetermined region of a sample put into a vacuum tank by a focused ion beam, and a method of ion beam machining thereof.

A focused ion beam machining device can carry out a fine machining and therefore, it is mainly used for changing wirings of semiconductor devices, modifying patterns of masks or reticles. A focused ion beam where ions are focused into a fine beam, is irradiated on, for example, extraneous portions of a mask while repeatedly scanning the portions by which the extraneous portions of the mask can be removed by a process referred to as sputtering. In respect of the mask the extraneous portions of which are removed by irradiation, only a pattern film constituting the extraneous portions is swiftly removed and a substrate thereunder is not to be machined. In recent years, a device or a method using ion beam assisted etching is used. According to the device or the method, in irradiating a focused ion beam onto an extraneous portion of a mask pattern film, as a method of supplying a small amount of steam to carbon tetrachloride or the like, as shown by FIG. 2 as an example, water is put into a reservoir 6 and water vapor supplied from the reservoir 6 is supplied to a gas storage 18 via a control valve 19. The pressure at the gas storage 18 is measured by a vacuum gage 17 and the measured value is fed back to the control valve 19 whereby the pressure of the gas storage 18 is controlled. Steam gas of which pressure is controlled, is supplied to a vacuum tank 21 via a valve 5 and a gas injector 9. A flow rate of the gas from the gas injector 9 is determined by the pressure at the gas storage 18, the conductance of the gas injector 9 and the pressure of the vacuum tank 21 and accordingly, the flow rate of the gas from the gas injector 9 is controlled constant by constantly controlling the pressure of the gas storage 18.

According to a conventional gas supply system of the flow rate of steam gas by using the control valve in the focused ion beam device using an assist gas, as shown by FIG. 2, the control valve 19, the pressure controller 16, the gas storage 18, the vacuum gage 17 for measuring the pressure of the gas storage 18 and the pressure controller 16 are needed whereby the system becomes complicated, bulky and expensive.

SUMMARY OF THE INVENTION

In order to resolve the above-described problem, salt hydrate is used as a supply source of steam gas, a reservoir filled with salt hydrate is connected to a gas injector via a valve, the temperature of the reservoir is measured by a temperature sensor such as a thermocouple or the like attached to the reservoir and the temperature of the reservoir is controlled by feeding back the measured value to a heater attached to the reservoir thereby supplying steam gas of which flow rate is controlled into a vacuum tank.

According to the above-described means, in the simplest system where the gas injector is connected to the reservoir by the valve, the small-sized and inexpensive heater and the temperature sensor are attached to the reservoir filled with salt hydrate and only the temperature of the reservoir is controlled by which steam gas of which flow rate is controlled can be supplied into the vacuum tank.

DETAILED DESCRIPTION

An explanation will be given of embodiments of the present invention in reference to the drawings.

Figure 1:
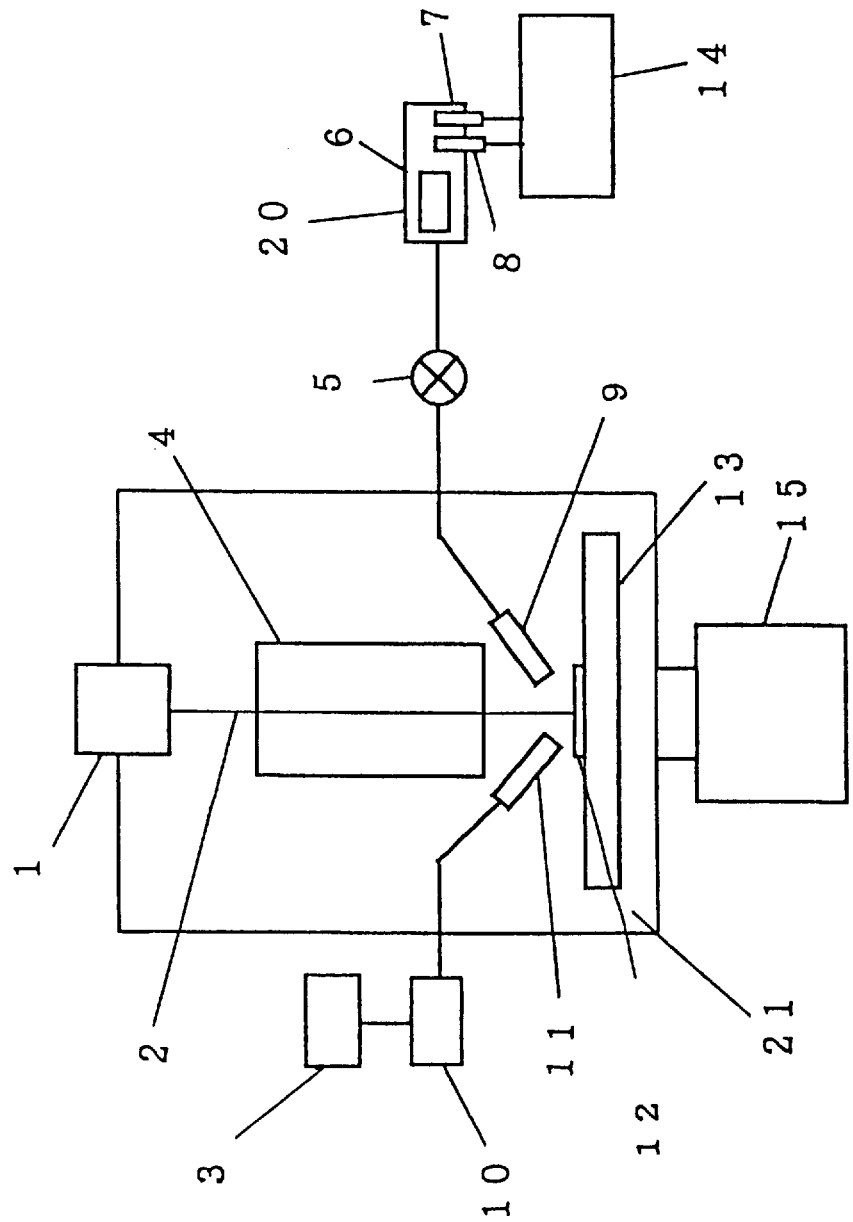
FIG. 1 is a figure for showing an embodiment of the present invention.
Figure 2:
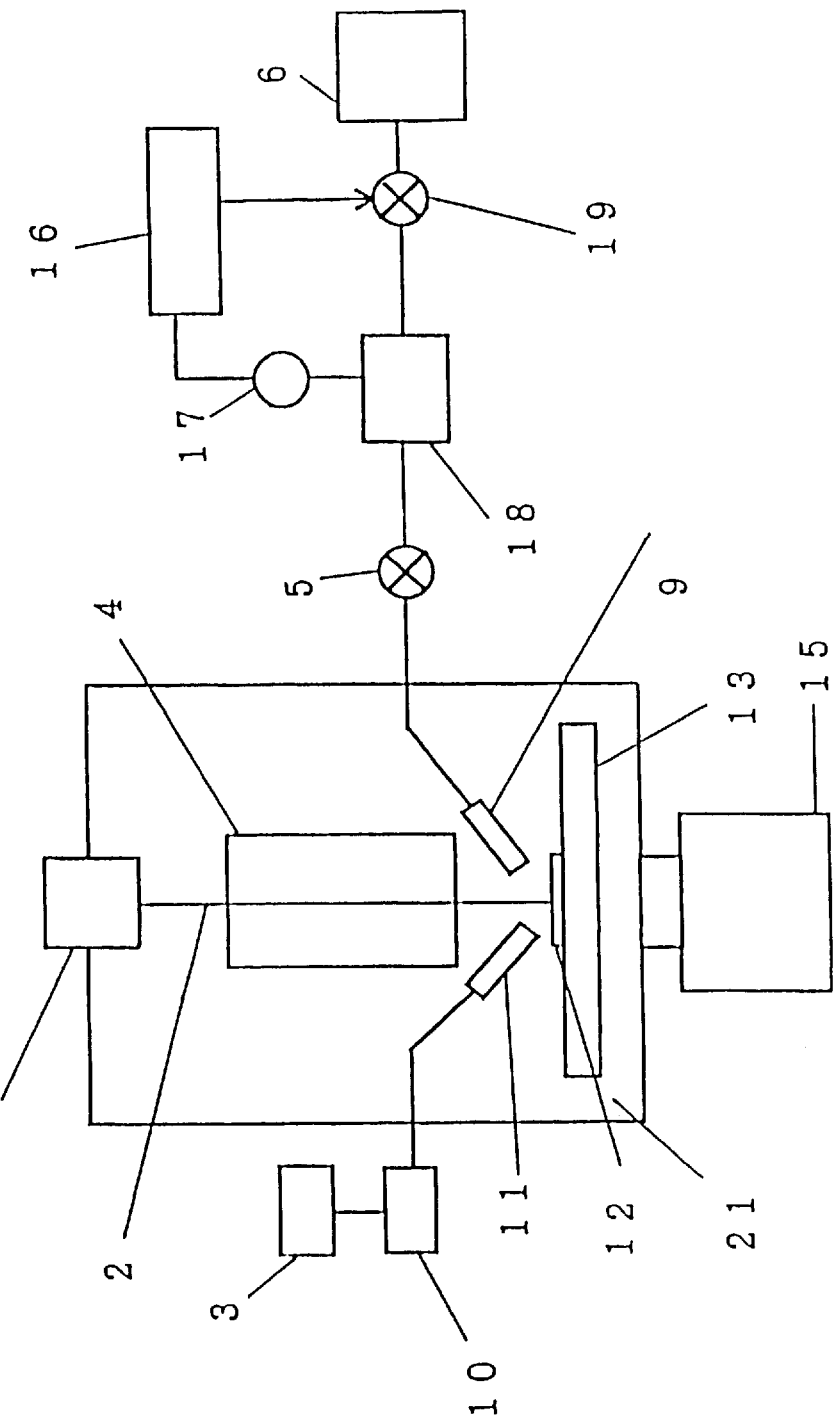
FIG. 2 is a figure for explaining a conventional technology.

FIG. 1 shows an ion beam machining device according to the present invention. Ions generated by an ion source 1 are focused by an ion optical system 4 in a vacuum tank 21 exhausted by a vacuum pump 15, a focused ion beam 2 is irradiated on a sample 12 on a stage 13, secondary particles emitted from the sample 12 is detected by a detector 11, the surface of the sample 12 is imaged by a display device 3 by supplying signals from the detector 11 to the display device 3 via an A/D converter 11, a machining region of the sample 12 is determined based on the imaging operation and a gas including steam gas is blown from a gas injector 9 in machining a sample 12 by the focused ion beam 2. The focused ion beam 2 scans and irradiates at a specific area of the sample 12. The sample 12 comprises a substrate and a patterned film thereon. The gas including steam gas is supplied by a salt hydrate 20 filled in the reservoir 6, the temperature of the reservoir 6 is measured by a temperature sensor 7, for example, a thermocouple, a heater 8 is controlled by a temperature controller 14 based on the measured temperature such that the measured temperature becomes a temperature whereby steam pressure from the salt hydrate 20 becomes a desired pressure by which the temperature of the reservoir is controlled to a desired temperature, when the steam gas generated from the salt hydrate 20 in the reservoir is flown via a valve 5, the valve 5 is opened, and the ion beam machining using the assist gas is carried out by blowing the gas onto the sample 12 via the gas injector 9.

In the above embodiment, iron iodide ($FeI_2 \cdot nH_2O$) is used as the salt hydrate 20. Also, magnesium sulfate ($MgSO_4 \cdot nH_2O$) can be used. Iron iodide ($FeI_2 \cdot nH_2O$) is better than magnesium sulfate ($MgSO_4 \cdot nH_2O$), because vapor containing halogen vapor from iron iodide ($FeI_2 \cdot nH_2O$) is generated at lower temperature than from that.

Figure 3:
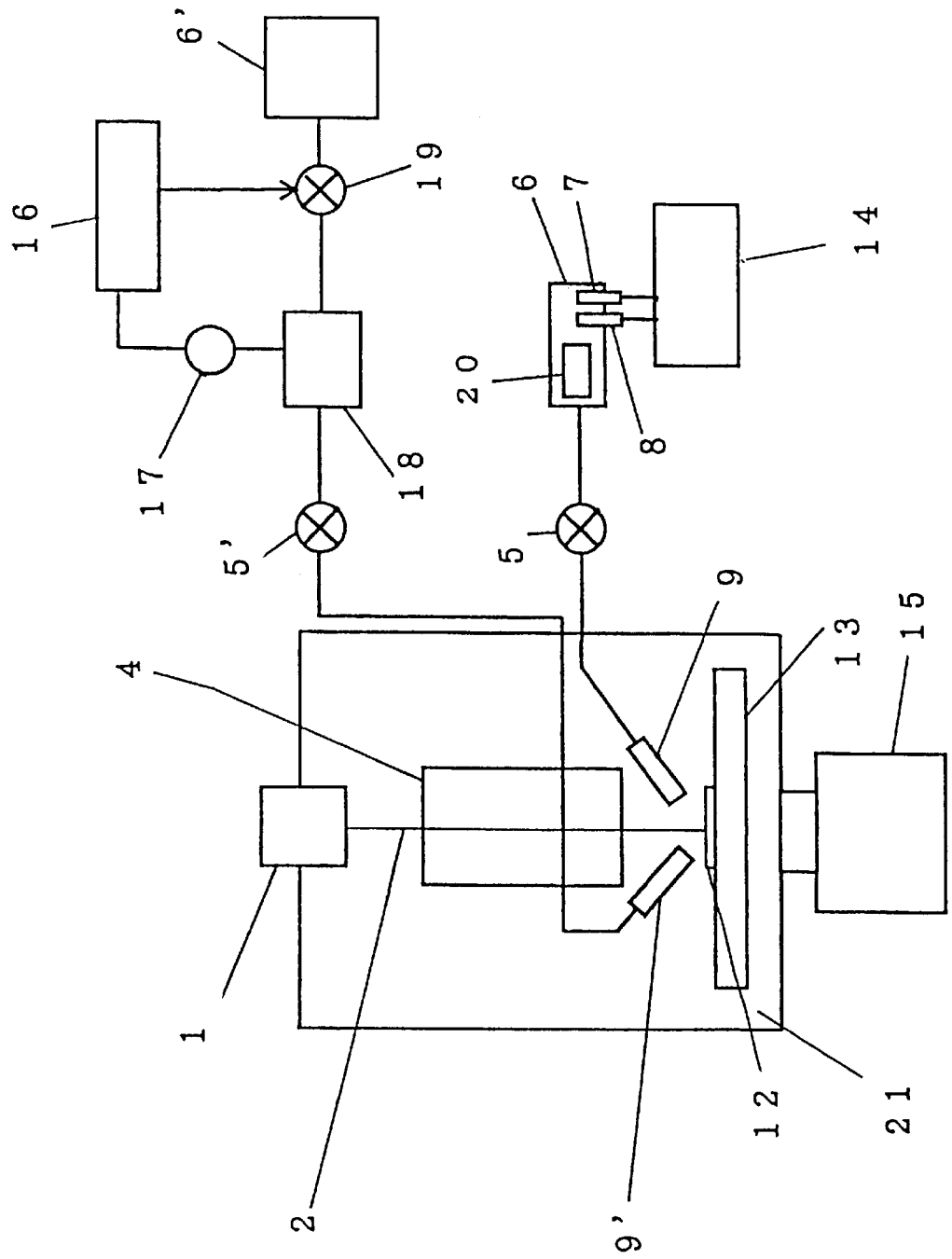
FIG. 3 is a figure for showing other embodiment of the present invention.

FIG. 3 shows a case where a mixture gas of the gas from salt hydrate and other gas is supplied as an assist gas where the other gas is supplied by controlling the other gas by a control valve 19 in which the pressure in a gas storage 18 is measured by a vacuum gage 17 and the pressure at the gas storage 18 is made constant by a pressure controller 16. In this case, the steam gas from the salt hydrate 20 of which steam pressure is controlled by the temperature control, is blown onto the sample 12 from the gas injector 9 and the other gas from a reservoir 6' controlled by a control valve 5', is blown onto the sample 12 from a gas injector 9' thereby blowing the gases as the mixture gas on the sample 12.

In the embodiment of FIG. 3, the mixture gas is a mixture of water vapor from iron iodide($FeI_2 \cdot nH_2O$) and iodine vapor. A iodine vapor has a slightly etching phenomenon against metals as used mask pattern film.

The specific area (to be moved away) irradiated with the focused ion beam 2 and directed with the assist gas (vapor) is etched out, and then the correct pattern film is reformed.

As described above, according to the present invention, a system supplying an assist gas including steam gas can be fabricated as a least bulky system and can be fabricated inexpensively.

What is claimed is:

1. A focused ion beam machining device in which ions generated from an ion source are clustered into a focused ion beam by an ion lens system in a vacuum tank exhausted by a vacuum pump, the focused ion beam is irradiated by scanning on a predetermined region of a surface of a sample where a thin film is formed on a surface of a matrix thereof by a scanning electrode, secondary particles emitted from the sample are detected by a detector, signals from the detector are supplied to a display device via an A/D converter thereby imaging the sample and an ion beam machining is conducted with respect to the predetermined region based on a result of imaging;

wherein in an assist gas supply unit having a gas injector for supplying an assist gas at least including steam gas to the predetermined region and the gas injector is constituted by a nozzle for blowing the assist gas, one or more of reservoirs constituting an etching gas supply source, heaters for heating at least one of the reservoirs, temperature sensors for measuring temperatures of the reservoirs, a temperature controller of the heaters for controlling the temperatures of the reservoirs based on measured values of the temperature sensors and a valve installed between the temperature controller and the gas injector, a salt hydrate for supplying the steam gas is filled in the reservoirs provided with the heaters and the temperature sensors, the steam gas for blowing to the predetermined region is supplied by heating the salt hydrate and an amount of the steam gas is controlled by controlling the temperatures of the reservoirs by the temperature sensors, the heaters and the temperature controller.

2. A focused ion beam machining method for correcting a film pattern formed on a substrate comprising:

irradiating with a scanning focused ion beam at a specific area of a sample having a mask pattern;

heating a salt hydrate stored in a reservoir for generating a water vapor;

controlling the heating for controlling a generation amount of the water vapor;

directing with the water vapor from a gas injector at the specific area of the sample, simultaneously with the irradiation with the focused ion beam.

3. A focused ion beam machining method as claimed in claim 2 wherein the water vapor contains halogen vapor.

4. A focused ion beam machining method as claimed in claim 3 wherein the halogen vapor is iodine vapor.

5. A focused ion beam machining method as claimed in claim 2 wherein the salt hydrate is iron iodide($FeI_2 \cdot nH_2O$).

* * * * *